(12) United States Patent
Sakaguchi et al.

(10) Patent No.: US 6,760,960 B2
(45) Date of Patent: Jul. 13, 2004

(54) METHOD OF FORMING ELECTRODE PATTERN OF SURFACE ACOUSTIC WAVE DEVICE

(75) Inventors: Kenji Sakaguchi, Komatsu (JP); Toshiyuki Fuyutsume, Ishikawa-ken (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 0 days.

(21) Appl. No.: 10/246,624

(22) Filed: Sep. 19, 2002

(65) Prior Publication Data

US 2003/0090173 A1 May 15, 2003

(30) Foreign Application Priority Data

Sep. 19, 2001 (JP) ........................................ 2001-285164

(51) Int. Cl.[7] .......................... H04R 17/00; G03C 5/00; H01L 41/04; H01L 41/08; H01L 41/18
(52) U.S. Cl. ...................... 29/25.35; 29/890.1; 430/313; 310/365
(58) Field of Search ............................ 29/25.35, 890.1; 310/800, 365, 366; 427/100; 347/68; 346/140.1; 430/320, 311, 313

(56) References Cited

U.S. PATENT DOCUMENTS

| | | | | |
|---|---|---|---|---|
| 4,004,044 A | * | 1/1977 | Franco et al. ............ 204/192.32 |
| 4,174,219 A | * | 11/1979 | Andres et al. ............... 430/321 |
| 5,188,924 A | * | 2/1993 | Ikari et al. .................... 430/312 |
| 5,294,858 A | * | 3/1994 | Nakahata et al. ........ 310/313 A |
| 5,355,568 A | * | 10/1994 | Imai et al. ................... 29/25.35 |
| 5,401,544 A | * | 3/1995 | Nakahata et al. ............ 427/585 |
| 5,460,922 A | * | 10/1995 | Swirbel et al. ............. 430/315 |
| 5,497,726 A | * | 3/1996 | Shikata et al. ................. 117/89 |
| 5,760,408 A | * | 6/1998 | Kikuchi et al. ........... 250/492.2 |

FOREIGN PATENT DOCUMENTS

| | | | | |
|---|---|---|---|---|
| JP | 10233641 | * | 2/1998 | ............ H03H/3/08 |
| JP | 10-233641 A | | 9/1998 | |
| JP | 2001-053569 A | | 2/2001 | |

* cited by examiner

*Primary Examiner*—Carl J. Arbes
*Assistant Examiner*—Tai Nguyen
(74) *Attorney, Agent, or Firm*—Keating & Bennett, LLP

(57) ABSTRACT

A method of forming an electrode pattern of a surface acoustic wave device easily and reliably prevents the occurrence of an abnormality in the shape of a resist pattern. In the electrode pattern forming method, a resist layer is formed on a top surface of a piezoelectric substrate, and then exposed to ultraviolet rays through a photomask provided above the top surface of the piezoelectric substrate to form a resist pattern on the surface of the piezoelectric substrate. Furthermore, a conductor film is formed on the top surface of the piezoelectric substrate, and the resist pattern is removed by a liftoff method to form an electrode pattern of the surface acoustic wave device. Exposure is performed using ultraviolet rays having a wavelength which is completely absorbed into the piezoelectric substrate without reaching the bottom surface of the piezoelectric substrate.

12 Claims, 8 Drawing Sheets

METHOD OF FORMING ELECTRODE PATTERN OF SURFACE ACOUSTIC WAVE DEVICE

BACKGROUND OF THE INVENTION

1. Field of the Invention

The present invention relates to a method of forming an electrode pattern of a surface acoustic wave device, for example, a SAW (Surface Acoustic Wave) filter.

2. Description of the Related Art

As a method of forming an electrode pattern of a surface acoustic wave device, the method described below is conventionally used. First, a resist layer is formed on a top surface of a piezoelectric substrate made of lithium tantalate ($LiTaO_3$) or lithium niobate ($LiNbO_3$), and a photomask is formed on the resist layer. Next, exposure is performed by irradiating the top surface of the piezoelectric substrate with ultraviolet rays referred to as "g-line (wavelength 436 nm)" rays or "i-line (wavelength 365 nm)" rays from above, and then development is performed to form a resist pattern. Then, a conductor film of Al is deposited on the top surface of the piezoelectric substrate, and then the resist remaining on the top surface of the piezoelectric substrate is removed together with the conductor film formed on the resist pattern. As a result, an electrode pattern is formed in the portion of the top surface of the piezoelectric substrate which is not covered with the resist pattern.

However, in the above-described electrode forming method, as shown in FIG. 11, ultraviolet rays applied to the top surface of a piezoelectric substrate 1 through a transmission hole 6 of a photomask 5 during exposure mostly pass through a resist layer 2 and enter the piezoelectric substrate 1. The ultraviolet rays entering the piezoelectric substrate 1 are reflected diffusely by the bottom surface of the piezoelectric substrate 1, and the diffused reflection ultraviolet rays again return to the top surface of the piezoelectric substrate 1 to reach a portion of the resist layer, which should not be exposed, thereby causing the problem of exposing the portion of the resist layer to light. Particularly, when the bottom surface of the piezoelectric substrate is roughened, diffused reflection is increased. Consequently, the resist pattern formed by subsequent development has a shape that is different from an initial desired shape, thereby causing the problem of failing to obtain a desired electrode pattern. Particularly, it is known that when the light width or space width of the resist pattern is about 1 µm or less, this problem becomes significant.

As a method for solving the problem, Japanese Unexamined Patent Application Publication No. 10-233641 discloses an electrode pattern forming method. This method includes previously forming an anti-reflection film on the bottom surface of the piezoelectric substrate, and then forming an electrode pattern. Specifically, an organic polymer film containing a dye having absorptivity for the wavelength of ultraviolet irradiation light is used as the anti-reflection film. As shown in FIG. 12, when ultraviolet rays applied to the resist layer 2 through the transmission hole 6 of the photomask 5 during exposure partially pass through the resist layer 2 and enter the piezoelectric substrate 1, the ultraviolet rays are absorbed by the anti-reflection film 3 disposed on the bottom surface of the piezoelectric substrate 1 to prevent reflection from the bottom surface of the piezoelectric substrate 1. Therefore, the occurrence of abnormalities in the shape of the resist pattern is prevented. A back conductor film 4 formed below the anti-reflection film 3 functions to cause any static electricity produced by heat treatment during the exposure step to escape to the outside.

However, the above-described electrode pattern forming method requires the additional step of forming the anti-reflection film which complicates and extends the manufacturing process, thereby increasing the manufacturing cost. Also, the piezoelectric substrate and the anti-reflection film have different refractive indexes, and thus light reflected from the interface cannot be completely removed to inevitably cause reflection of a slight ultraviolet ray. Therefore, the occurrence of an abnormality in the shape of the resist pattern cannot be completely prevented.

SUMMARY OF THE INVENTION

In order to overcome the problems described above, preferred embodiments of the present invention provide a method of forming an electrode pattern of a surface acoustic wave device which is capable of easily and completely preventing the occurrence of an abnormality in the shape of a resist pattern.

In accordance with a preferred embodiment of the present invention, a method of forming an electrode pattern of a surface acoustic wave device includes the steps of forming a resist layer on a top surface of a piezoelectric substrate, exposing the resist layer to ultraviolet rays through a photomask provided above the top surface of the piezoelectric substrate to form a resist pattern, forming a conductor film over the piezoelectric substrate, and removing the resist pattern, wherein the step of exposing the resist layer is performed by using ultraviolet rays having a wavelength that is completely absorbed into the piezoelectric substrate without reaching the bottom surface of the piezoelectric substrate.

By using the above-described method of forming an electrode pattern of a surface acoustic wave device, the electrode pattern can be obtained according to a desired design because the ultraviolet rays are absorbed into the piezoelectric substrate without reaching the bottom surface of the piezoelectric substrate. Also, the conventional step of forming an anti-reflection film on the bottom surface of the piezoelectric substrate is not required, which decreases the time and costs required for the manufacturing process.

Furthermore, exposure to ultraviolet rays with a short wavelength permits the formation of a resist pattern having a line width or space width of about 0.25 µm or less, thereby further miniaturizing the surface acoustic wave device. Also, the focal depth of ultraviolet ray in exposure is inversely proportional to the wavelength of the ultraviolet ray. Thus, in forming a resist pattern having the same line width or space width as a conventional value, the focal depth is significantly increased to extend the exposure area of a stepper, which is an expensive device, thereby improving throughput and decreasing manufacturing cost.

In the method of forming the electrode pattern of the surface acoustic wave device of preferred embodiments of the present invention, for example, exposure is preferably performed through a photomask having a slightly wider opening than a desired resist line, and the resist pattern is preferably formed to have a reverse tapered sectional shape.

By using the photomask having the slightly wider opening than the desired resist line as described above, the resist pattern can be controlled to a desired width with a relatively small exposure. Also, when the resist pattern is formed to have a reverse tapered sectional shape, a separating solution used for separating the resist pattern easily permeates to the bottom (the interface with the piezoelectric substrate) of the resist pattern, improving the separating property of the resist pattern.

In the method of forming the electrode pattern of the surface acoustic wave device of preferred embodiments of the present invention, for example, the piezoelectric substrate preferably includes a lithium tantalate substrate and has a thickness of about 0.2 mm or greater, and the wavelength of the ultraviolet ray is preferably about 265 nm or less.

As described above, when the lithium tantalate substrate having a thickness of about 0.2 mm or greater is used as the piezoelectric substrate, and ultraviolet rays with a wavelength of about 265 nm or less is used as the ultraviolet rays for exposure, the ultraviolet rays are absorbed into the piezoelectric substrate without reaching the bottom surface of the piezoelectric substrate, and thus, the electrode pattern can be obtained according to a desired design.

In the method of forming the electrode pattern of the surface acoustic wave device of preferred embodiments of the present invention, for example, the piezoelectric substrate preferably includes a lithium niobate substrate and has a thickness of about 0.2 mm or greater, and the wavelength of the ultraviolet rays is preferably about 305 nm or less.

As described above, when the lithium niobate substrate having a thickness of about 0.2 mm or greater is used as the piezoelectric substrate, and ultraviolet rays with a wavelength of about 305 nm or less is used as the ultraviolet ray for exposure, the ultraviolet rays are absorbed into the piezoelectric substrate without reaching the bottom surface of the piezoelectric substrate, and thus the electrode pattern can be obtained according to a desired design.

In the method of forming the electrode pattern of the surface acoustic wave device of preferred embodiments of the present invention, for example, a KrF or ArF excimer laser light is preferably used as the ultraviolet ray, and a chemical amplification-type negative photoresist is preferably used as the resist.

As a means for realizing the ultraviolet ray with a wavelength of about 265 nm or less, a KrF excimer laser exposure device and an ArF excimer laser exposure device can be used. A combination of such an excimer laser and a chemical amplification-type negative photoresist enables the formation of the resist pattern having a line width or space width of about 0.25 µm or less.

The method of forming the electrode pattern of the surface acoustic wave device of preferred embodiments of the present invention is effective, for example, for a case in which a resist pattern has a line width or space width of about 1 µm or less.

As described above, when the electrode pattern having a line width or space width of about 1 µm or less is formed by a liftoff method, a desired resist pattern cannot be obtained due to the influence of light reflected by the rear surface of the piezoelectric substrate. Therefore, the method of forming the electrode pattern of the surface acoustic wave device of preferred embodiments of the present invention is effective for a case in which an electrode pattern having a line width or space width of about 1 µm or less is formed by the liftoff method.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

A preferred embodiment of the present invention will be described below with reference to the drawings. In this preferred embodiment, an electrode pattern of a surface acoustic wave device is preferably formed by using a negative resist step.

Figure 1:
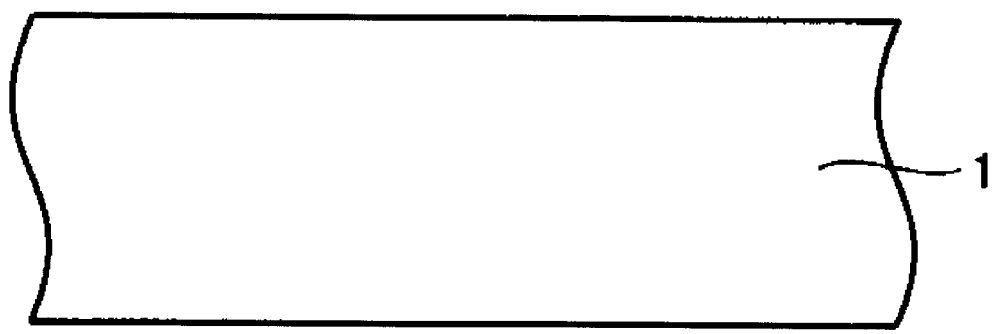
FIG. 1 is a sectional view of a piezoelectric substrate, for illustrating a method of forming an electrode pattern according to a preferred embodiment of the present invention.

FIGS. 1 to 6 are sectional views respectively illustrating the steps of a method of forming an electrode pattern of a surface acoustic wave device of this preferred embodiment. As shown in FIG. 1, this preferred embodiment uses a piezoelectric substrate 1 having a thickness of about 0.2 mm. As the piezoelectric substrate 1, for example, a lithium tantalate substrate or a lithium niobate substrate is preferably used. Also, the bottom surface of the piezoelectric substrate is preferably previously roughened. Roughening is performed for transmitting only a surface acoustic wave of a surface acoustic wave and a bulk wave, which are produced from an input electrode disposed on the surface of the piezoelectric substrate, to an output electrode, in order to cause the surface acoustic wave device to function as a frequency selective device. More specifically, roughening is a treatment for scattering the bulk wave propagating through the piezoelectric substrate by the bottom surface of the piezoelectric substrate to minimize and eliminate the influence on the output electrode.

Figure 2:
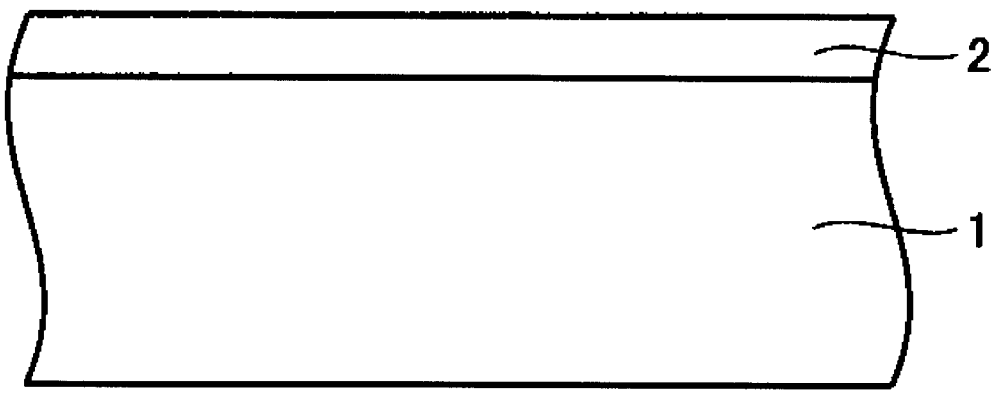
FIG. 2 is a sectional view of a piezoelectric substrate after coating of a resist, for illustrating a method of forming an electrode pattern according to a preferred embodiment of the present invention.

As shown in FIG. 2, a resist layer 2 including an organic polymer material is first formed on the top surface of the piezoelectric substrate 1 after hydrophobing of the surface with HMDS (hexamethyl disilane). HMDS treatment is performed for improving adhesion between the piezoelectric substrate 1 and the resist layer 2. The resist layer 2 is formed in a film on the top surface of the piezoelectric substrate 1 by, for example, spin coating.

As the organic polymer material used for the resist layer 2, a chemical amplification-type negative photoresist more suitable for fine manufacturing is used with recent miniaturization of patterns. The chemical amplification-type negative photoresist is preferably a photoresist material which includes an acid generator and a dissolution inhibitor, and which can selectively form a developer insoluble portion and an insoluble portion due to interaction between these components when being exposed to ultraviolet ray. By using the chemical amplification-type negative photoresist, a desired resist pattern remains without being removed from the surface of the piezoelectric substrate in a subsequent development step. In the present invention in which light is not reflected from the bottom surface of a wafer, a positive photoresist cannot be used. This is because a reverse tapered resist suitable for a subsequent step of removing the resist pattern cannot be formed, and thus a forward tapered shape is formed.

Figure 3:
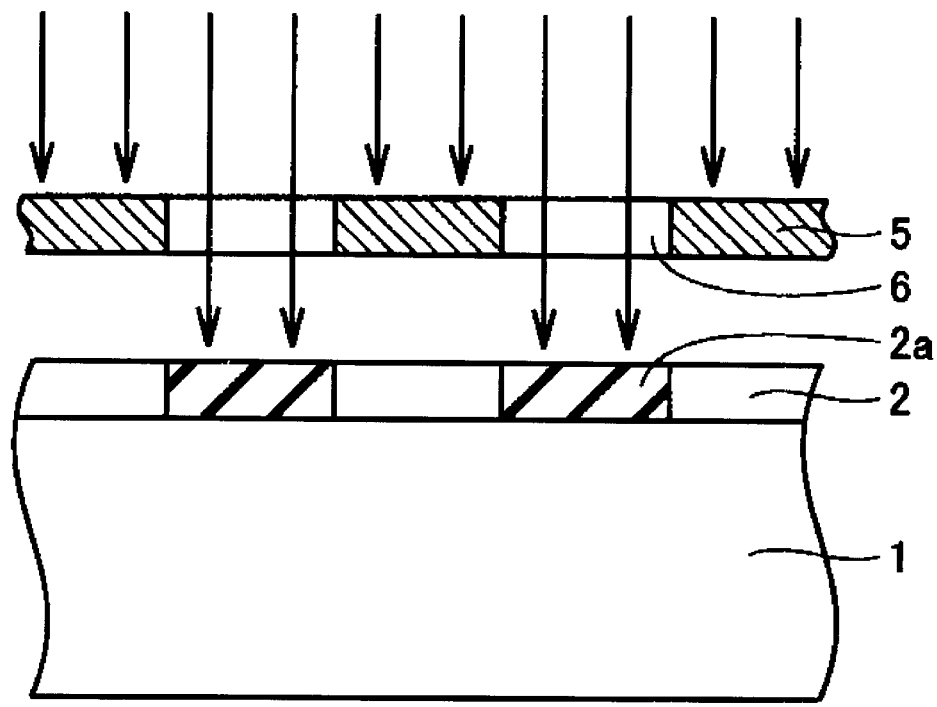
FIG. 3 is a sectional view of a piezoelectric substrate in an exposure step, for illustrating a method of forming an electrode pattern according to a preferred embodiment of the present invention.
Figure 4:
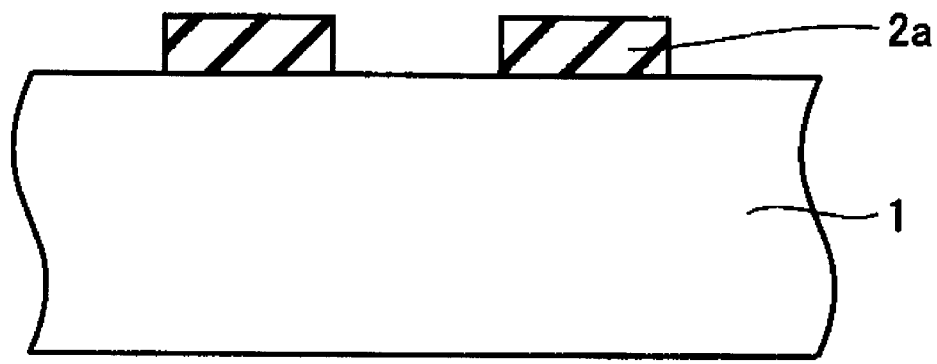
FIG. 4 is a sectional view of a piezoelectric substrate after formation of a resist pattern, for illustrating a method of forming an electrode pattern according to a preferred embodiment of the present invention.

Next, as shown in FIG. 3, a photomask 5 is disposed at a distance from the surface of the piezoelectric substrate 1. The photomask 5 preferably includes, for example, a light transmitting plate having a light shielding film formed on a predetermined portion, and a transmitting hole 6 formed in a portion without the light shielding film to transmit light. After the photomask 5 is formed, the top surface of the piezoelectric substrate 1 is irradiated with ultraviolet rays from above the photomask 5. As the ultraviolet rays, ultraviolet rays with a short wavelength, which are absorbed into the piezoelectric substrate 1, are used. Of the irradiation ultraviolet rays, ultraviolet rays reaching the transmitting hole 6 pass through the transmitting hole 6 and reach the resist layer 2. As a result, the resist layer 2 is partially exposed to form a resist pattern 2a.

Then, development is performed. Since this preferred embodiment uses the negative photoresist, the unexposed portion of the resist layer is removed from the surface of the piezoelectric substrate 1 by an alkali developer to leave only the reverse-tapered resist pattern 2a on the top surface of the piezoelectric substrate 1, which is suitable for the liftoff method, thereby obtaining the structure shown in FIG. 4.

Figure 5:
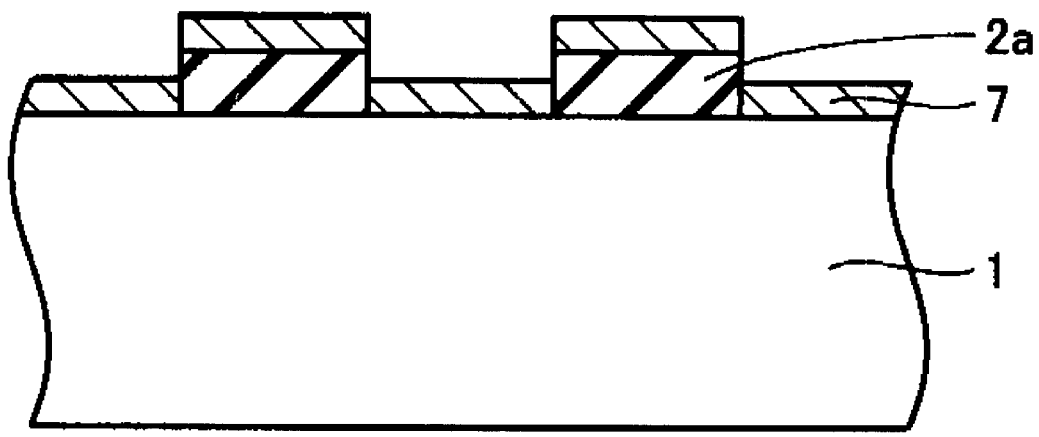
FIG. 5 is a sectional view of a piezoelectric substrate after formation of a conductor film, for illustrating a method of forming an electrode pattern according to a preferred embodiment of the present invention.

Then, as shown in FIG. 5, a conductor film 7 is deposited on the surface of the piezoelectric substrate 1. Applicable examples of a deposition method include a vapor deposition method, a sputtering method, and other suitable methods. As a result, the conductor film 7 is formed not only on the exposed portion of the surface of the piezoelectric substrate 1 but also on the resist pattern 2a.

Figure 6:
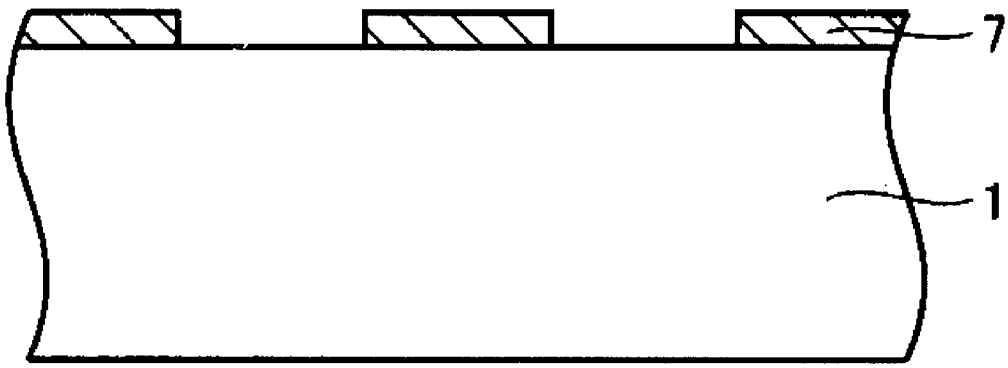
FIG. 6 is a sectional view of a piezoelectric substrate after separation of a resist pattern, for illustrating a method of forming an electrode pattern according to a preferred embodiment of the present invention.

Then, the remaining resist pattern 2a is removed by the liftoff method together with the conductor film 7 formed on the resist pattern 2a to form a desired electrode pattern on the surface of the piezoelectric substrate 1 (refer to FIG. 6). In the case of a SAW filter, a comb-like electrode pattern referred to as an "IDT (Interdigital Transducer)" is formed, in which input electrodes and output electrodes are alternately disposed to engage with each other.

Figure 7:
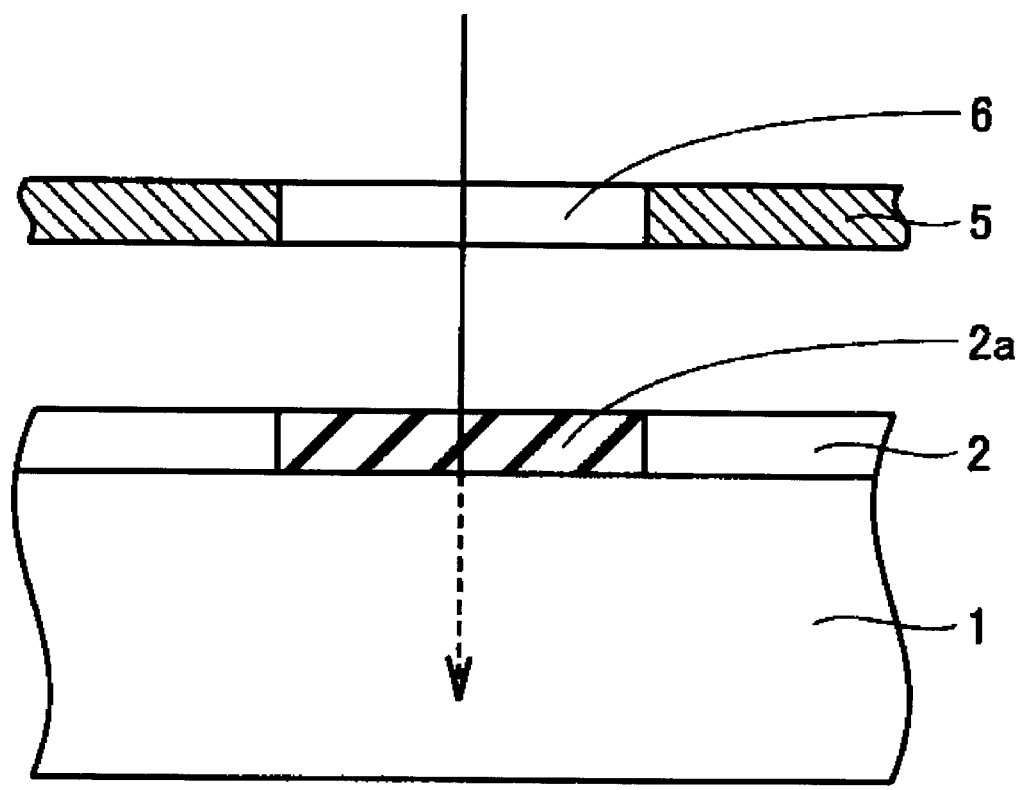
FIG. 7 is a schematic drawing illustrating the effect of the use of a method of forming an electrode pattern according to a preferred embodiment of the present invention.

By using the above-described electrode pattern forming method for forming an electrode pattern of a surface acoustic wave device, ultraviolet rays are absorbed into the piezoelectric substrate to completely prevent reflection of the ultraviolet rays by the bottom surface of the piezoelectric substrate (refer to FIG. 7) unlike a conventional method, thereby securely obtaining the electrode pattern according to a desired design. Also, unlike in a conventional method, an anti-reflection film does not need to be provided for preventing reflection of the ultraviolet rays by the bottom surface of the piezoelectric substrate, thereby shortening the manufacturing process to decrease the manufacturing cost. Furthermore, exposure to ultraviolet rays with a short wavelength permits the formation of a resist pattern having a line width or a space width of about 0.25 $\mu$m or less, thereby permitting further miniaturization of the surface acoustic wave device.

In the above-described electrode pattern forming method, ultraviolet rays are completely absorbed into the piezoelectric substrate to prevent reflection of ultraviolet rays by the bottom surface of the piezoelectric substrate. In order that light is absorbed into a material, it is generally necessary that the band gap of the material coincides with or is smaller than the energy (wavelength) of irradiation light. Alternatively, light energy is transferred to electrons due to resonance with electrons to absorb light. Therefore, not all materials absorb light, and the wavelength of absorbable light varies with materials. Furthermore, whether or not light is completely absorbed into a material is influenced by the thickness of the material through which light is transmitted. In order to form the electrode pattern by the above method, therefore, a wavelength with which light is completely absorbed into the piezoelectric substrate without reaching a bottoms surface thereof must be previously confirmed. The measurement method and the results of measurement of experiment conducted by the inventors for confirming the wavelength of ultraviolet rays absorbable by each of a lithium tantalate substrate and a lithium niobate substrate are described below.

Figure 8:
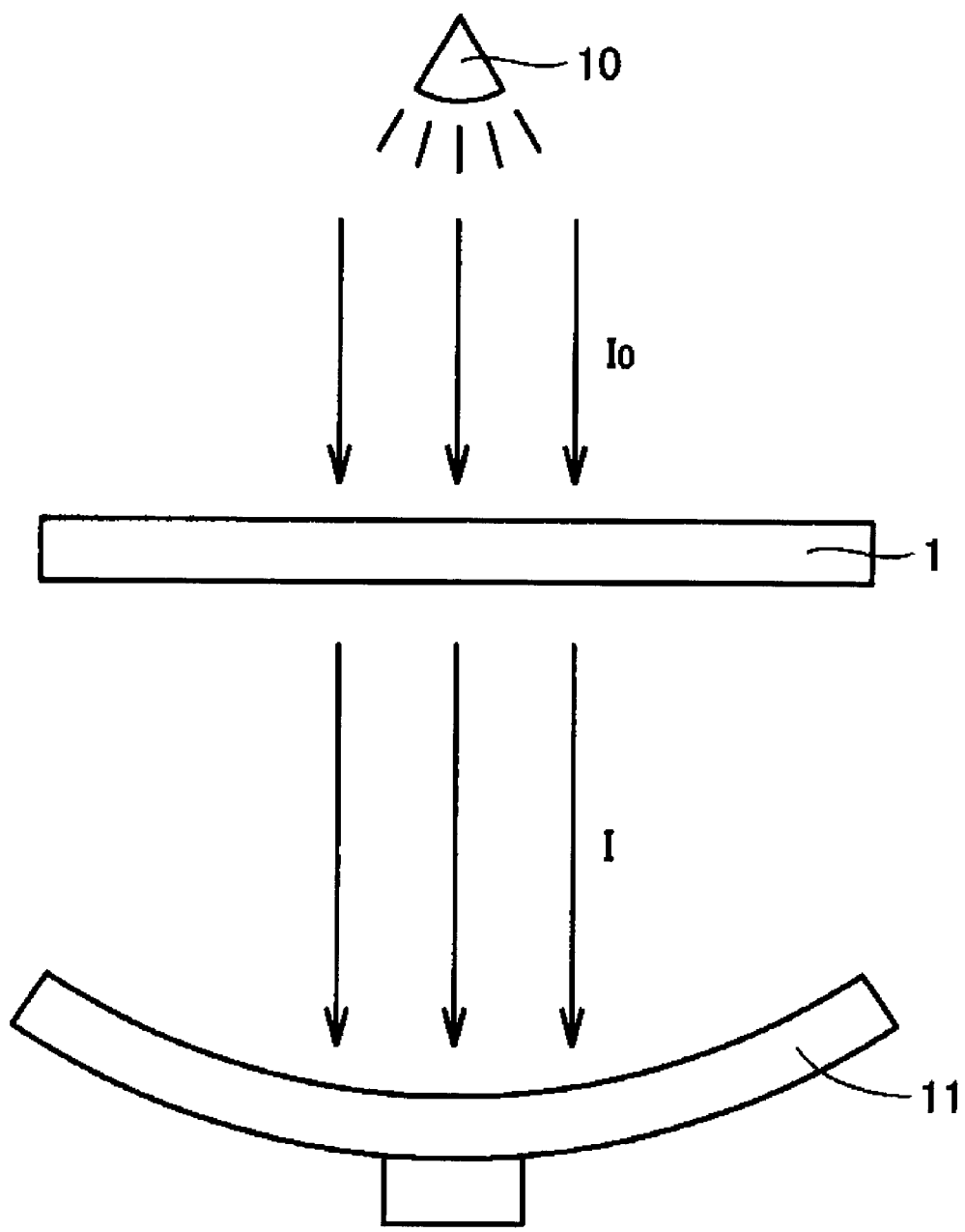
FIG. 8 is a schematic drawing illustrating the construction of an experimental apparatus for determining the wavelength of ultraviolet ray used in an exposure step.

FIG. 8 is a schematic drawing showing the construction of an apparatus used for experiment by the inventors. As shown in FIG. 8, ultraviolet rays of predetermined intensity $I_0$ is radiated from a light source 10 toward an ultraviolet detector 11. A piezoelectric substrate 1 having a predetermined thickness is inserted into the optical path of the ultraviolet rays, and the intensity I of ultraviolet rays transmitted through the piezoelectric substrate 1 is measured by the ultraviolet detector 11 to calculate transmittance. The transmittance is represented by a percentage of the intensity I of transmitted light to the intensity $I_0$ of incident light. The intensity $I_0$ of incident light is measured by using the intensity of ultraviolet rays detected by the ultraviolet detector 11 without the piezoelectric substrate 1 inserted.

Figure 9:
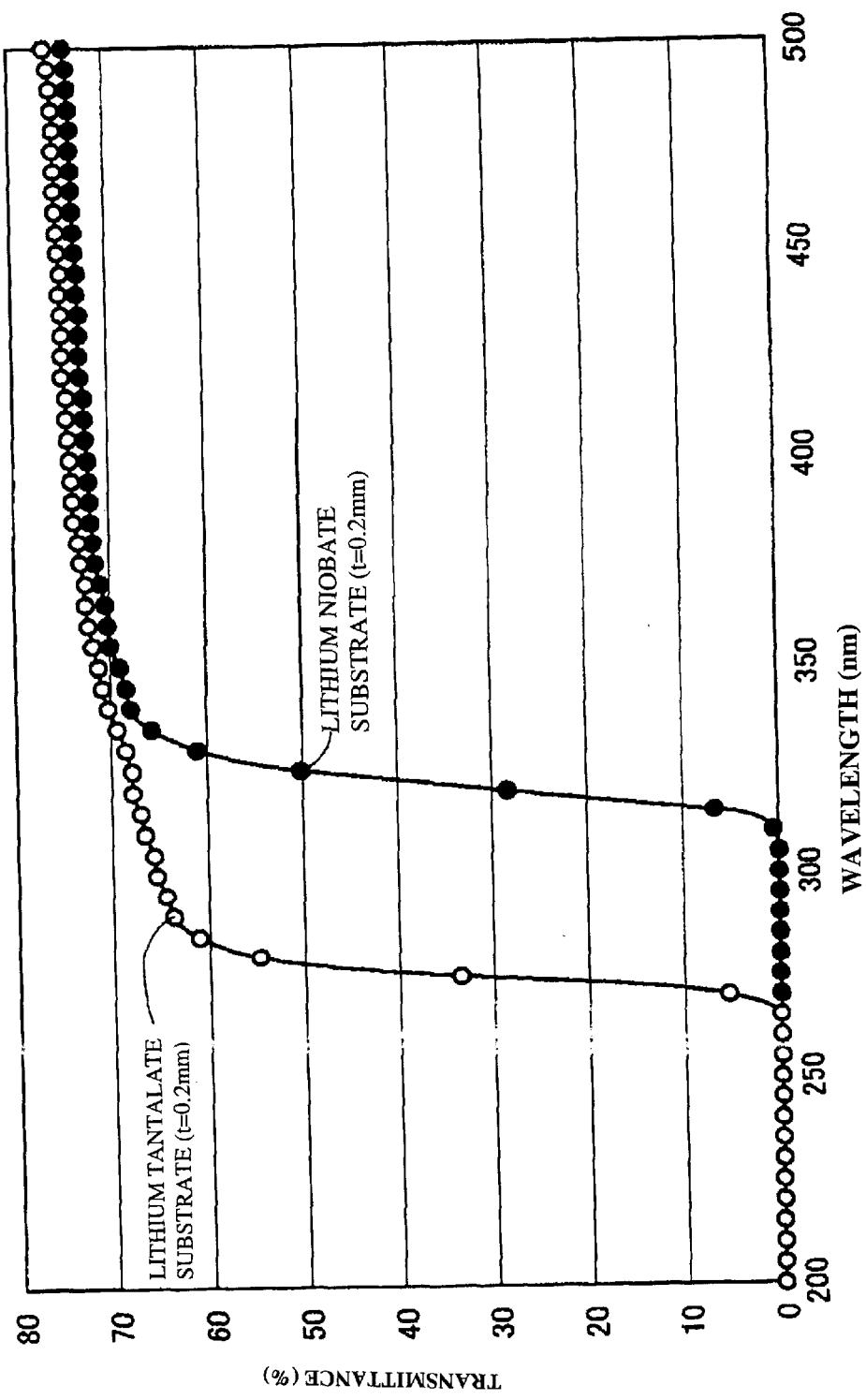
FIG. 9 is a graph showing the transmittance of ultraviolet ray measured by the experimental apparatus shown in FIG. 8.

FIG. 9 shows the results of measurement of the transmittance of ultraviolet rays transmitted through the piezoelectric substrate 1 by the above measurement method. The results of measurement were obtained by using the lithium tantalate substrate and the lithium niobate substrate each having a thickness t of about 0.2 mm. Also, the wavelength of ultraviolet rays radiated from the light source was in the range of about 200 nm to about 500 nm, and the step was about 5 nm.

It was confirmed from this figure that with the lithium tantalate substrate, ultraviolet rays are completely absorbed into the piezoelectric substrate with an ultraviolet wavelength of about 265 nm or less. It was also confirmed that with the lithium niobate substrate, ultraviolet rays are completely absorbed into the piezoelectric substrate with an ultraviolet wavelength of about 305 nm or less. It was thus confirmed that during exposure, reflection of ultraviolet rays by the rear surface of the piezoelectric substrate is completely prevented by using ultraviolet rays with a wavelength of about 265 nm or less for the lithium tantalate substrate and ultraviolet rays with a wavelength of about 305 nm or less for the lithium niobate substrate. A KrF excimer laser light (wavelength of about 248 nm) and ArF excimer laser light (wavelength of about 193 nm) are known as the ultraviolet ray with a wavelength of about 305 nm or less, and F2 (about 163 nm) is known as a light source for a shorter wavelength.

In this way, the wavelength of ultraviolet rays completely absorbed by the piezoelectric substrate used is previously measured, and conditions of exposure are determined based on the results of measurement. This enables sufficient patterning according to a desired design when the electrode pattern of the surface acoustic wave device is formed.

Figure 10A:
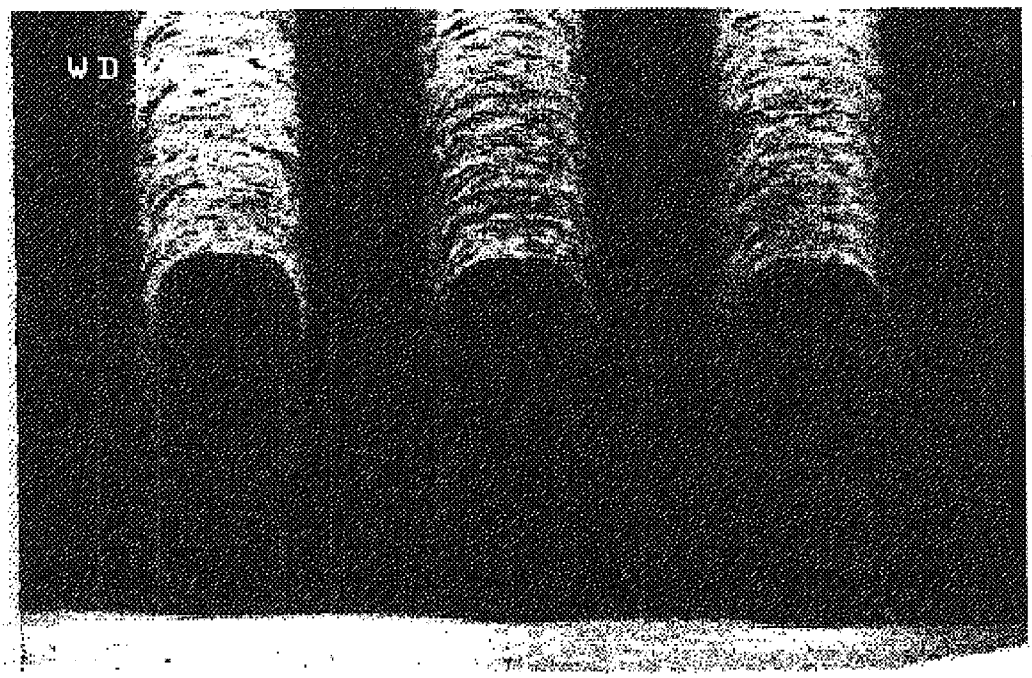
FIG. 10A is an electron microscope photograph of a resist pattern formed on a piezoelectric substrate by using a method of forming an electrode pattern according to a preferred embodiment of the present invention.

FIG. 10A is an electron microscope photograph of a resist pattern for forming an electrode pattern on a lithium tantalate substrate of about 0.2 mm in thickness by using KrF excimer laser light (wavelength of about 248 nm) based on the results of measurement. In this case, the exposure was about 50 mJ/cm$^2$, and the design rule was about 0.2 $\mu$m. This electron microscope photograph shows the end surface of the resist pattern formed on the surface of the piezoelectric substrate, as obliquely viewed from above. It can be confirmed that the reverse tapered resist pattern is formed to project upwardly from the lower piezoelectric substrate. It can also be confirmed that no resist remains in the spaces of the resist pattern on the surface of the piezoelectric substrate, and thus no abnormality occurs in the shape and configuration of the resist pattern. It is thus found that the resist pattern according to a desired design can be obtained to permit the realization of the formation of a desired electrode pattern. Consequently, by using the method of preferred embodiments of the present invention for forming the electrode pattern, a surface acoustic wave device applicable to a 5-GHz SAW filter can be manufactured.

Figure 10B:
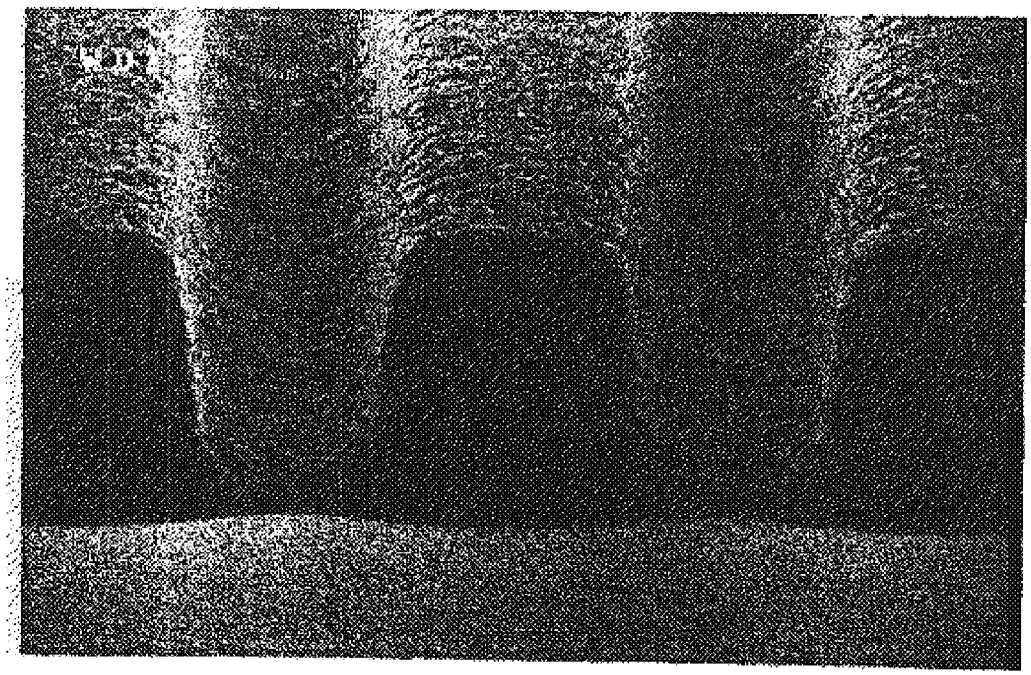
FIG. 10B is an electron microscope photograph of a resist pattern formed on a piezoelectric substrate by using a conventional method.
Figure 11:
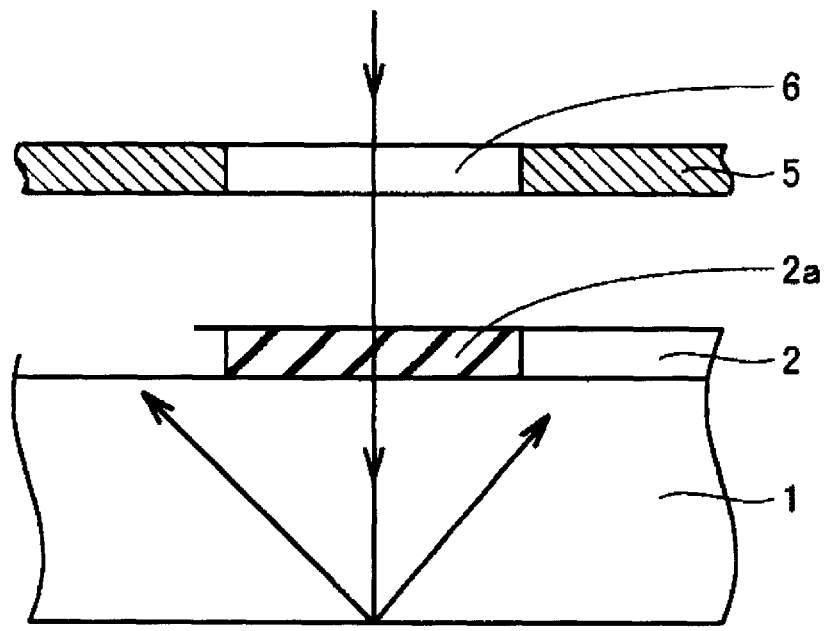
FIG. 11 is a schematic drawing illustrating the problem of a conventional method of forming an electrode pattern of a surface acoustic wave device.
Figure 12:
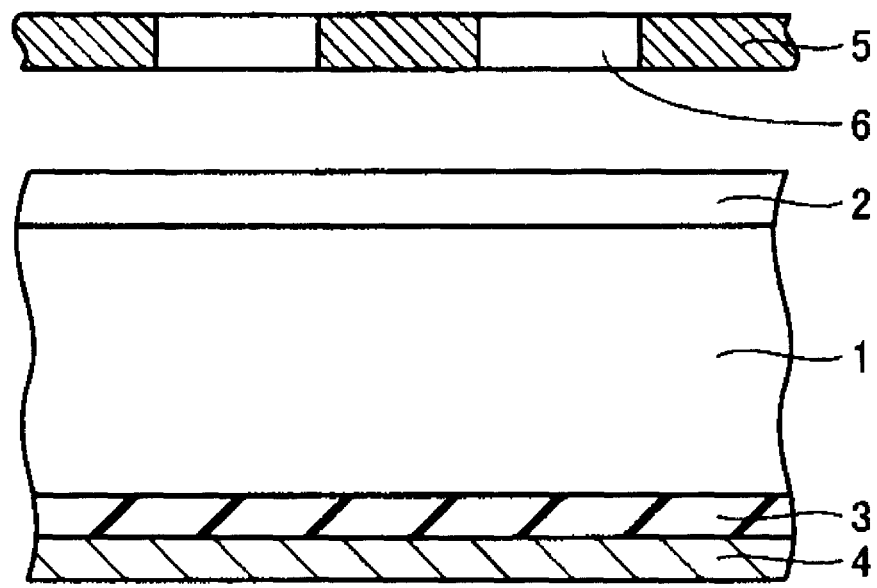
FIG. 12 is a sectional view illustrating another conventional method of forming an electrode pattern of a surface acoustic wave device.

For comparison, FIG. 10B shows an electron microscope photograph of a resist pattern formed by using a conventional anti-reflection back film. The piezoelectric substrate used was a lithium tantalate substrate having a thickness of about 0.2 mm, and an i-line (about 365 nm) was used as an ultraviolet ray with an exposure was about 150 mJ/cm$^2$ and a design rule of about 0.6 $\mu$m. This electron microscope photograph was taken at the same angle as FIG. 10A. In this case, it is found that even if the anti-reflection back film is provided, reflection is not completely eliminated, and the residual resist adheres to the surface of the piezoelectric substrate in the spaces of the resist pattern, thereby failing to obtain a desired resist pattern. The design rule corresponds to a 2-GHz SAW filter.

Although, in this preferred embodiment, the piezoelectric substrate including lithium tantalate or lithium niobate is described above as an example, the piezoelectric substrate is not limited to this. The substrate material is particularly suitable for a surface acoustic wave device used as a RF (Radio Frequency) filter, and other examples of the substrate material include a lithium borate single crystal ($Li_2B_4O_7$) and a langasite single crystal ($La_3Ga_5SiO_{14}$) suitable for an IF (Intermediate-Frequency) filter, and other suitable materials.

Although, in this preferred embodiment, the thickness of the piezoelectric substrate used is preferably about 0.2 mm as an example, the thickness is, of course, not limited to this, and any substrate thickness may be used in the range of about 0.15 mm to about 0.5 mm, which is suitable for manufacturing the surface acoustic wave device. However, as described above, the wavelength of ultraviolet rays that are completely absorbed by the piezoelectric substrate changes with the thickness of the piezoelectric substrate, and thus the wavelength of ultraviolet rays used for exposure must be previously determined by the above experiment.

The above-described preferred embodiments are not restrictive, and the present invention is not limited to the above-described preferred embodiments. The technical scope of the present invention is defined by the claims, and includes meanings equivalent to the claims and any modifications within the scope of the claims.

The present invention can easily prevent the occurrence of an abnormality in the shape of a resist pattern and completely prevent the occurrence of such abnormalities, thereby enabling the formation of a resist pattern accurately according to a desired design. Therefore, an electrode pattern can be formed with very high precision, as compared with a conventional method of forming an electrode pattern of a surface acoustic wave device. Since an anti-reflection back film conventionally required is not required in preferred embodiments of the present invention, an electrode pattern can easily be formed at low cost.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method of forming an electrode pattern of a surface acoustic wave device, comprising steps of:
   providing a piezoelectric substrate;
   forming a resist layer on a top surface of the piezoelectric substrate;
   exposing the resist layer to ultraviolet rays through a photomask provided above the top surface of the piezoelectric substrate to form a resist pattern;
   forming a conductor film over the top surface piezoelectric substrate; and
   removing the resist pattern;
   wherein the step of exposing the resist layer to ultraviolet rays is performed by using ultraviolet rays having a wavelength such that the ultraviolet rays are completely absorbed into the piezoelectric substrate without reaching a bottom surface of the piezoelectric substrate.

2. A method of forming an electrode pattern of a surface acoustic wave device according to claim 1, wherein the step of exposing the resist layer to ultraviolet rays is performed through a photomask having a slightly wider opening than a desired width of a resist line to be formed as part of the resist pattern.

3. A method of forming an electrode pattern of a surface acoustic wave device according to claim 1, wherein the resist pattern is formed to have a reverse tapered sectional shape.

4. A method of forming an electrode pattern of a surface acoustic wave device according to claim 1, wherein the piezoelectric substrate includes a lithium tantalate substrate and has a thickness of about 0.2 mm or greater, and the wavelength of the ultraviolet rays is about 265 nm or less.

5. A method of forming an electrode pattern of a surface acoustic wave device according to claim 1, wherein the piezoelectric substrate includes a lithium niobate substrate and has a thickness of about 0.2 mm or greater, and the wavelength of the ultraviolet rays is about 305 nm or less.

6. A method of forming an electrode pattern of a surface acoustic wave device according to claim 1, wherein the ultraviolet rays are one of a KrF and a ArF excimer laser light, and the resist is a chemical amplification-type negative photoresist.

7. A method of forming an electrode pattern of a surface acoustic wave device according to claim 1, wherein the resist pattern has a line width or a space width of about 1 μm or less.

8. A method of forming an electrode pattern of a surface acoustic wave device according to claim 1, further comprising the step of selecting a thickness of the piezoelectric substrate in accordance with a wavelength of the ultraviolet rays to be used in the step of exposing the resist layer.

9. A method of forming an electrode pattern of a surface acoustic wave device according to claim 1, further comprising the step of preparing the top surface of the piezoelectric substrate before the step of forming a resist layer by hydrophobing the top surface of the piezoelectric substrate with hexamethyl disilane.

10. A method of forming an electrode pattern of a surface acoustic wave device according to claim 1, wherein the resist layer is formed of an organic polymer material.

11. A method of forming an electrode pattern of a surface acoustic wave device according to claim 1, wherein the resist layer is formed of a chemical amplification-type negative photoresist.

12. A method of forming an electrode pattern of a surface acoustic wave device according to claim 1, wherein the piezoelectric substrate is made of one of lithium borate single crystal, langasite single crystal, lithium tantalite, and lithium niobate.

* * * * *